(12) United States Patent
Raschke et al.

(10) Patent No.: US 11,914,287 B2
(45) Date of Patent: Feb. 27, 2024

(54) CONTAINER FOR HOLDING AND TRANSPORTING RETICLES HAVING A TRANSPARENT WINDOW ASSEMBLY

(71) Applicant: ENTEGRIS, INC., Billerica, MA (US)

(72) Inventors: Russ V. Raschke, Chanhassen, MN (US); Shawn D. Eggum, Lonsdale, MN (US)

(73) Assignee: ENTEGRIS, INC., Billerica, MA (US)

( * ) Notice: Subject to any disclaimer, the term of this patent is extended or adjusted under 35 U.S.C. 154(b) by 411 days.

(21) Appl. No.: 16/631,121

(22) PCT Filed: Jul. 16, 2018

(86) PCT No.: PCT/US2018/042275
§ 371 (c)(1),
(2) Date: Jan. 14, 2020

(87) PCT Pub. No.: WO2019/018281
PCT Pub. Date: Jan. 24, 2019

(65) Prior Publication Data
US 2020/0159109 A1 May 21, 2020

Related U.S. Application Data

(60) Provisional application No. 62/535,660, filed on Jul. 21, 2017.

(51) Int. Cl.
*G03F 1/66* (2012.01)
*H01L 21/673* (2006.01)

(52) U.S. Cl.
CPC .......... *G03F 1/66* (2013.01); *H01L 21/67359* (2013.01); *H01L 21/67376* (2013.01); *H01L 21/67386* (2013.01)

(58) Field of Classification Search
CPC .... G03F 1/66; G03F 7/70741; G03F 7/70033; G03F 7/2004; H01L 21/67359; H01L 21/67376; H01L 21/67386

(Continued)

(56) References Cited

U.S. PATENT DOCUMENTS 5,148,103 A * 9/1992 Pasiecznik, Jr. ...... G01R 1/0735
324/754.08
5,642,054 A * 6/1997 Pasiecznik, Jr. ...... G01R 1/0735
324/755.09

(Continued)

FOREIGN PATENT DOCUMENTS

| EP | 01662324 A2 | 5/2006 |
| JP | 2000340642 A | 12/2000 |
| JP | 2005086092 A | 3/2005 |

*Primary Examiner* — J. Gregory Pickett
*Assistant Examiner* — Jenine Pagan

(57) ABSTRACT

A pod for transporting reticles includes an inner cover and an inner base plate. The inner base plate cooperates with the cover to establish a space for mounting a reticle. The inner base plate includes a hole having a perimeter and first and second flanges extending inward from the perimeter. A window assembly is mounted in the hole. The window assembly includes a transparent plate, a seal and a retainer. The seal contacts the outer or side planar surface of the transparent plate and the perimeter of the hole to seal an interface between the window assembly and the hole. The retainer contacts the second flange to retain the seal and transparent plate within the hole.

6 Claims, 6 Drawing Sheets

(58) Field of Classification Search
USPC .................................. 206/454, 777, 778
See application file for complete search history.

(56) References Cited

U.S. PATENT DOCUMENTS

| | | | |
|---|---|---|---|
| 8,091,592 B2* | 1/2012 | Sato | F16K 15/063 |
| | | | 141/98 |
| 2007/0146681 A1* | 6/2007 | Yamamoto | G03F 7/70983 |
| | | | 355/75 |
| 2007/0206173 A1* | 9/2007 | Suzuki | G03F 7/70741 |
| | | | 355/75 |
| 2009/0092385 A1 | 4/2009 | Cullen | |
| 2009/0103061 A1 | 4/2009 | Suzuki et al. | |
| 2009/0297299 A1 | 12/2009 | Campbell | |
| 2012/0175279 A1 | 7/2012 | Ku | |
| 2013/0051785 A1 | 2/2013 | Pope | |
| 2013/0126378 A1* | 5/2013 | Ku | H01L 21/67386 |
| | | | 206/454 |
| 2014/0291198 A1 | 10/2014 | Lu et al. | |
| 2015/0131069 A1* | 5/2015 | Ota | H01L 21/6773 |
| | | | 355/67 |
| 2017/0294326 A1* | 10/2017 | Raschke | H01L 21/67011 |

* cited by examiner

CONTAINER FOR HOLDING AND TRANSPORTING RETICLES HAVING A TRANSPARENT WINDOW ASSEMBLY

CROSS-REFERENCE TO RELATED APPLICATION

This application is a 371 National Stage application of International Application No. PCT/US2018/042275 filed on Jul. 16, 2018, which claims the benefit of and priority to U.S. Provisional Application No. 62/535,660 filed on Jul. 21, 2017, the entirely of which is incorporated herein by reference for all purposes.

TECHNICAL FIELD

This disclosure relates generally to the art of storing, transporting, shipping and processing fragile devices such as photomasks, reticles, semiconductor substrates and wafers.

BACKGROUND

Extreme ultraviolet (EUV) lithography is a developing technology employed to fabricate integrated circuits and other semiconductor devices. A reflective photomask, also called a reticle, is formed with a desired pattern that is reproduced on a vast number of substrates, also called wafers. The reticle is a flat glass plate, and each wafer is preferably a thin slice of semiconductor material. Generally, lithography involves exposing the wafer to a source of radiation, in this case, extreme ultraviolet radiation. The radiation is reflected off the reticle and onto the wafer to transfer the pattern from the reticle to the wafer.

With EUV lithography, the reticle is particularly sensitive to contamination and damage when compared to a reticle used in conventional photolithography. The difference in sensitivity is caused, in part, because the radiation is reflected off the reticle as opposed to being transmitted through the reticle. The radiation is reflected off the reticle because currently there are no materials, transparent to EUV radiation that can be used for a reticle.

The risk of contamination of the reticle generally occurs during transportation of the reticle in a container. The containers are typically sealed to prevent contamination from entering the containers. However, relative movement of the reticle and the container during transportation can cause particles to form and damage the reticle. Another problem is that the reticle can move from an initial position relative to the container and thus not be in proper alignment. When the reticle is removed from the container and placed into processing equipment, automated equipment is usually used. Therefore, any misalignment caused in transport may also be present during processing and cause the patterns formed on the wafers to be defective.

As can be seen from the above discussion, there exists a need in the art for a container assembly for holding a reticle that includes a window to facilitate sensing equipment to confirm that the reticle is in proper alignment with the container assembly. Preferably, the window is designed to prevent entry of contamination into the container assembly and to minimize generation of contamination during installation of the window.

SUMMARY

This disclosure relates generally to a pod for transporting reticles. The pod includes an inner cover and an inner base plate mounted within a cover and a base. The inner base plate is configured to cooperate with the cover to establish a space for mounting a reticle. The inner base plate includes a hole having a perimeter, a first flange extending inward from the perimeter and having a mounting surface and a second flange extending inward from the perimeter. A window assembly is configured to be mounted in the hole. The window assembly has a transparent plate with inner, outer and side planar surfaces, with the inner surface being configured to contact the mounting surface. The window assembly also has a seal contacting the outer or side planar surface of the transparent plate and configured to contact the perimeter of the hole and to seal an interface between the window assembly and the hole. A retainer is configured to contact the second flange and to retain the seal and transparent plate within the hole. The transparent plate is configured to facilitate viewing of a reticle supported on the inner base plate from outside the pod. In some embodiments, the retainer is configured to removably retain the seal and transparent plate within the hole.

In one illustrative embodiment, the retainer is made of a polymer. In another illustrative embodiment, the retainer is a snap ring, and the window assembly has a washer. In some cases, the snap ring is made of stainless steel, and the washer is made of stainless steel.

In some embodiments, the transparent plate is a rectangle having rounded corners, also referred to herein as a rounded rectangle. In other embodiments, the transparent plate is circular.

In some embodiments, the inner base plate is formed with a notched recess to facilitate removal of the window assembly with a tool. The inner base plate also includes an undercut area at the perimeter to receive the retainer.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

This disclosure may be more completely understood in consideration of the following description of various illustrative embodiments in connection with the accompanying drawings, in which.

Figure 1:
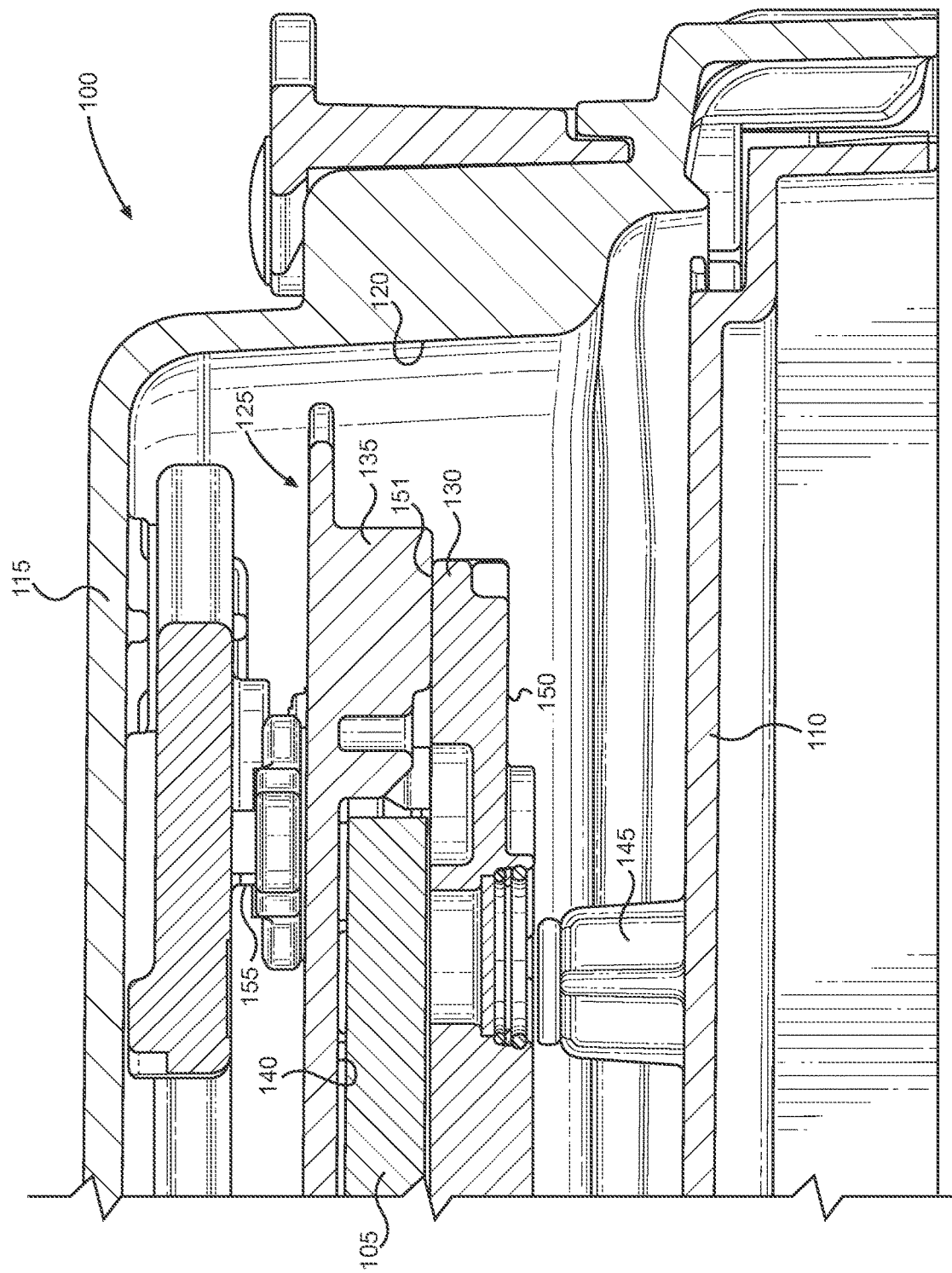
FIG. 1 shows a cross section of an EUV reticle pod in accordance with an embodiment of the disclosure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

With initial reference to FIG. 1, there is shown an exemplary EUV pod 100. Pod 100 is configured to hold a reticle 105, particularly an EUV reticle, for transport and storage. Pod 100 includes a base 110 and a cover 115. Base 110 and cover 115 form a sealed enclosure 120 suitable for containing an inner pod 125. Inner pod 125 includes an inner base plate 130 and an inner cover 135. Inner base plate 130 and inner cover 135 form a sealed enclosure 140 suitable for containing reticle 105. Base 110 includes locating protrusions 145 extending upward from the inner surface of base 110. Inner base plate 130 is supported on base 110, with locating protrusions 145 extending into recessed grooves (not visible) formed in a lower (or outer) face 150 of inner base plate 130 to locate inner pod 125 relative to pod 100. Reticle 105 is supported on an upper (or inner) face 151 of inner base plate 130. Cover 115 includes locating protrusions 155 extending downward from the inner surface of cover 115. Locating protrusions 155 extend into holes (not visible) formed in inner cover 135 to locate inner pod 125 relative to pod 100.

Figure 2:
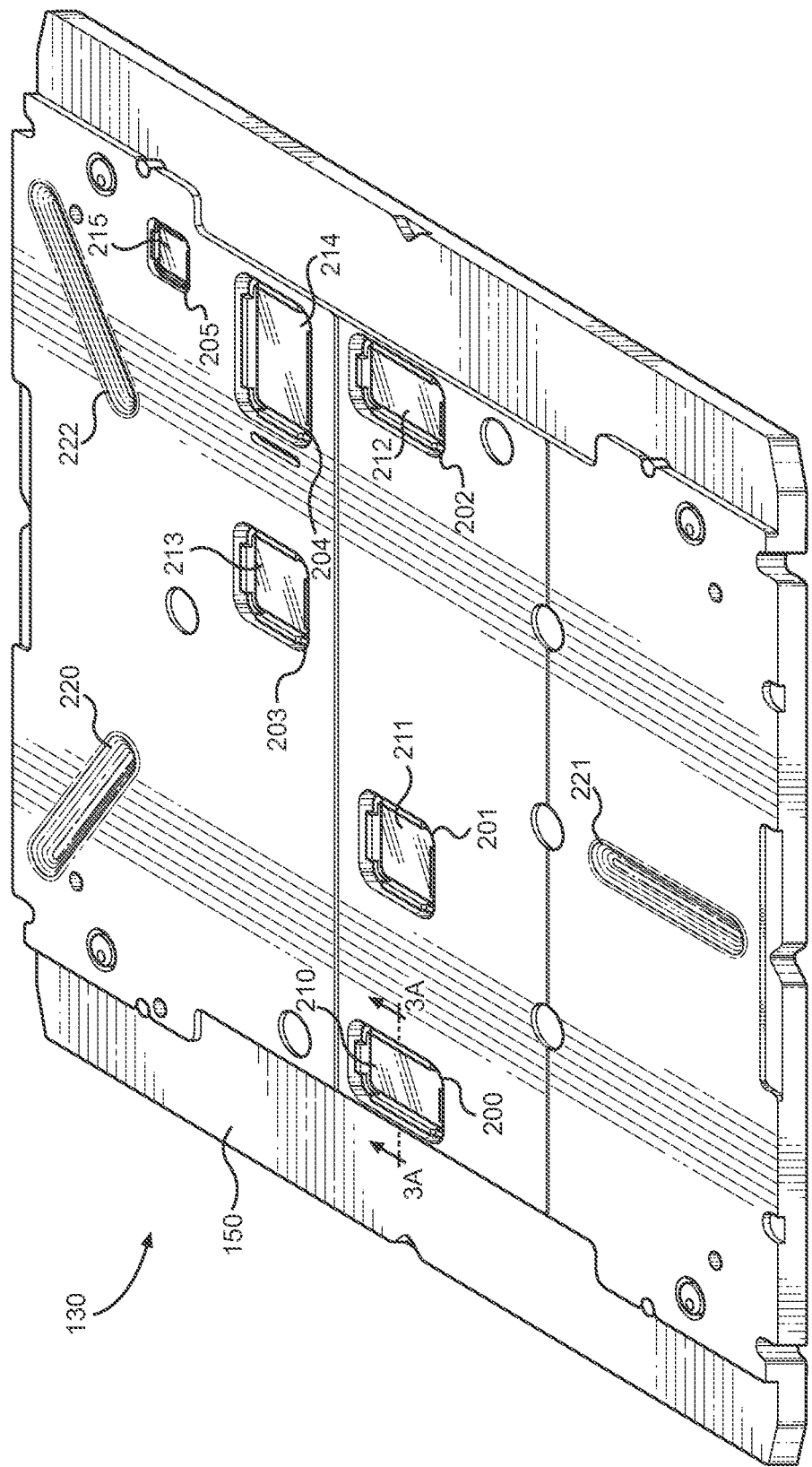
FIG. 2 shows a perspective view of an inner base plate of the pod shown in FIG. 1.

FIG. 2 shows lower face 150 of inner base plate 130. Inner base plate 130 includes a plurality of holes 200-205, each hole 200-205 including a corresponding window assembly 210-215. This facilitates sensing equipment (not shown) located below inner base plate 130 to determine the position of reticle 105 when reticle 105 is supported on upper face 151 of inner base plate 130 a shown in FIG. 1. Inner base plate 130 also includes a plurality of recessed grooves 220-222, which are configured to mate with locating protrusions 145 (FIG. 1) to align inner base plate 130 relative to base 105.

Figure 3A:
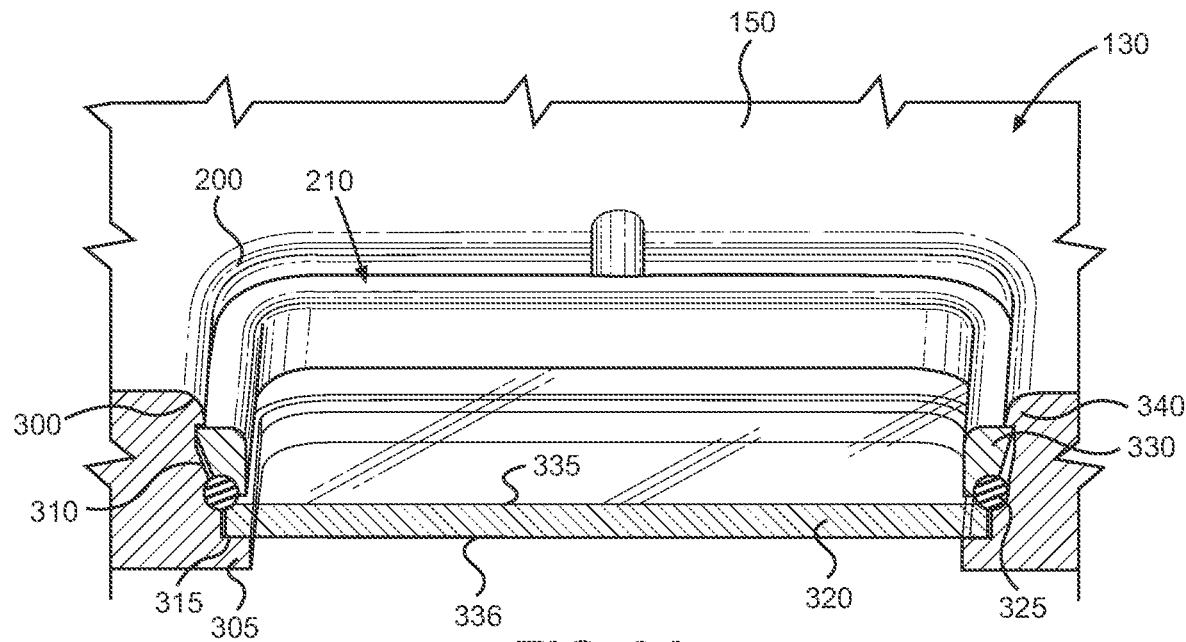
FIG. 3A shows a cross section of the base plate of FIG. 2 taken along the line 3-3 with a window mounted in the base plate and retained in place with a separate rectangular seal and window retainer.

With reference now to FIG. 3A, there is shown a cross section of inner base plate 130. Specifically, FIG. 3A shows hole 200 and window assembly 210. Hole 200 has a perimeter (or peripheral sidewall) 300. A flange 305 extends inward from perimeter 300, and an undercut (or recess) 310 extends outward into perimeter 300. Flange 305 has a mounting surface 315. Window assembly 210 includes a transparent plate 320, a seal 325 and a retainer 330. Plate 320 has an outer (or lower) planar surface 335 and an inner (or upper) planar surface 336, with inner planar surface 336 in contact with mounting surface 315. Plate 320 is configured to facilitate viewing of a reticle supported on upper face 151 of inner base plate 130. Seal 325 contacts outer planar surface 335 of plate 320 and undercut 310. Seal 325 is configured to seal the interface between window assembly 210 and hole 200. Retainer 330 contacts seal 325 and undercut 310 to retain seal 325 and plate 320 within hole 200. In some cases, retainer 330 is configured to removably retain seal 325 and plate 320 within hole 200. This retention is due to inner base plate 130 extending across window assembly 210 from above and below, thereby preventing vertical movement of window assembly 210. In particular, the inclusion of undercut 310 results in a second flange 340 extending inward from perimeter 300. Flange 340 prevents windows assembly 210 from moving outward (or down) through hole 200, while flange 305 prevents window assembly 210 from moving inward (or up) through hole 200. That is, contact between flange 340 and retainer 330 prevents outward movement of retainer 330, and contact between seal 325 and retainer 330 prevents inward movement of retainer 330 since seal 325 and plate 320 are held in place by flange 305 in that direction. Similarly, contact between flange 305 and plate 320 prevents inward movement of plate 320, and contact between seal 325 and plate 320 prevents outward movement of plate 320 since seal 325 and retainer 330 are held in place by flange 340 in that direction.

Figure 3B:
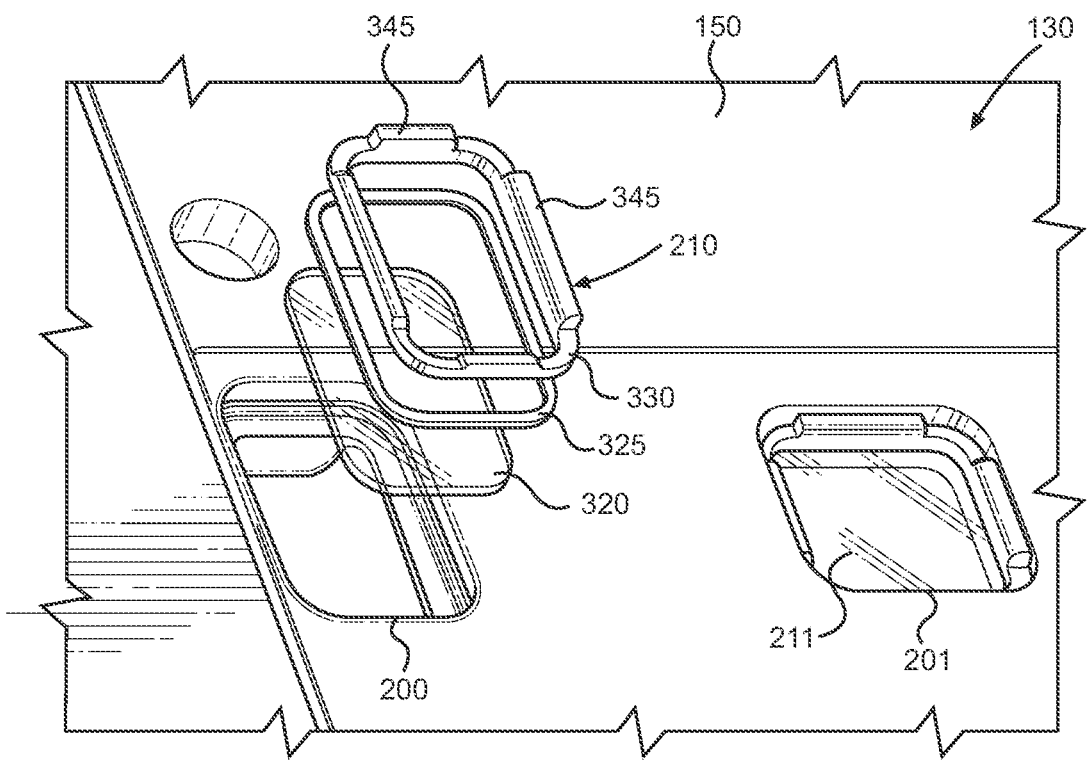
FIG. 3B shows an exploded view of the seal and window retainer of FIG. 3A.

FIG. 3B provides an exploded view of window assembly 210. This view highlights the rectangular shape of hole 200, plate 320, seal 325 and retainer 330, although this shape is more accurately termed a rounded rectangle because the rectangle has rounded corners. In addition, retainer 330 includes a plurality of protrusions 345. It is protrusions 345 that contact flange 340 when window assembly 210 is installed within hole 200. No threaded fasteners (e.g., screws) are needed to secure window assembly 210. In other words, window assembly 210 does not require a threaded fastener. This reduces particle generation, thereby reducing the chances of contaminating reticle 105. Preferably, inner base plate 130 is made from aluminum and plate 320 is made from glass, while each of seal 325 and retainer 330 is made from a polymer. Non-limiting examples of polymers suitable as polymer seals include fluorinated polymers, elastomeric polymers and thermoplastic elastomeric polymers. Preferred polymers are those that exhibit low levels of outgassing. The retainer may also include embodiments that are polymeric. Non-limiting examples of polymers suitable for the retainer include polyether ether ketone and polyether imide.

To mount window assembly 210 within hole 200, plate 320 is placed in contact with mounting surface 315. Next, seal 325 is placed in undercut 310, with seal 325 contacting outer planar surface 335 of plate 320. Retainer 330 is placed in undercut 310 such that retainer 330 contacts seal 325 and flange 340, thereby removably retaining seal 325 and plate 320 within hole 200. During insertion of retainer 330, seal 325 is compressed by retainer 330. The restorative force exerted by seal 325 helps maintain contact between retainer 330 and flange 340.

Figure 4A:
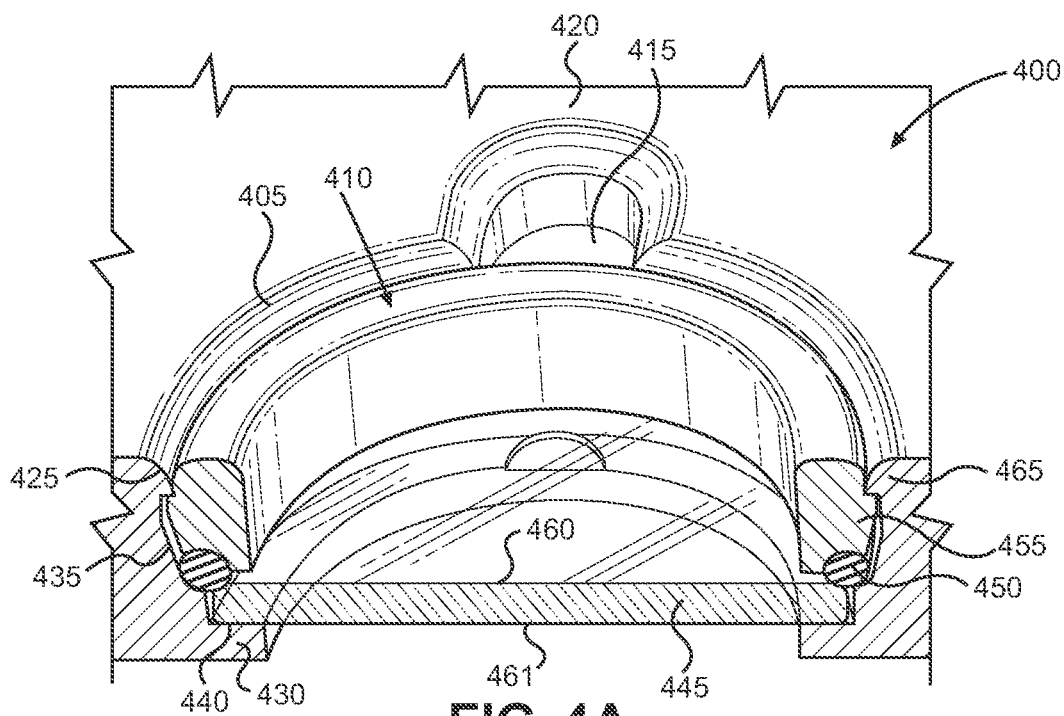
FIG. 4A shows a cross section of a window mounted in a base plate and retained in place with a separate circular seal and window retainer in accordance with an embodiment of the disclosure.

Turning now to FIG. 4A, there is shown a cross section of another inner base plate 400 constructed in accordance with an embodiment of the present disclosure. Inner base plate 400 includes a hole 405 and a window assembly 410 located in hole 405. A notched recess 415 is formed in a lower (or outer) face 420 of inner base plate 400. Notched recess 415 provides access for a tool (not shown) so that window assembly 410 can be removed from hole 405 with the tool without damaging window assembly 410. Hole 405 has a perimeter (or peripheral sidewall) 425. A flange 430 extends inward from perimeter 425, and an undercut (or recess) 435 extends outward into perimeter 425. Flange 430 has a mounting surface 440. Window assembly 410 includes a transparent plate 445, a seal 450 and a retainer 455. Plate 445 has an outer (or lower) planar surface 460 and an inner (or upper) planar surface 461, with inner planar surface 461 in contact with mounting surface 440. Plate 445 is configured to facilitate viewing of a reticle supported on inner base plate 400. Seal 450 contacts outer planar surface 460 of plate 445 and undercut 435. Seal 450 is configured to seal the interface between window assembly 410 and hole 405. Retainer 455 contacts seal 450 and undercut 435 to retain seal 450 and plate 445 within hole 405. In some cases, retainer 455 is configured to removably retain seal 450 and plate 445 within hole 405. This retention is due to inner base plate 400 extending across window assembly 410 from above and below, thereby preventing vertical movement of window assembly 410. In particular, the inclusion of undercut 435 results in a second flange 465 extending inward from perimeter 425. Flange 465 prevents windows assembly 410 from moving outward (or down) through hole 405, while flange 430 prevents window assembly 410 from moving inward (or up) through hole 405. That is, contact between flange 465 and retainer 455 prevents outward movement of retainer 455, and contact between seal 450 and retainer 455 prevents inward movement of retainer 455 since seal 450 and plate 445 are held in place by flange 430 in that direction. Similarly, contact between flange 430 and plate 445 prevents inward movement of plate 445, and contact between seal 450 and plate 445 prevents outward movement of plate 445 since seal 450 and retainer 455 are held in place by flange 465 in that direction.

Figure 4B:
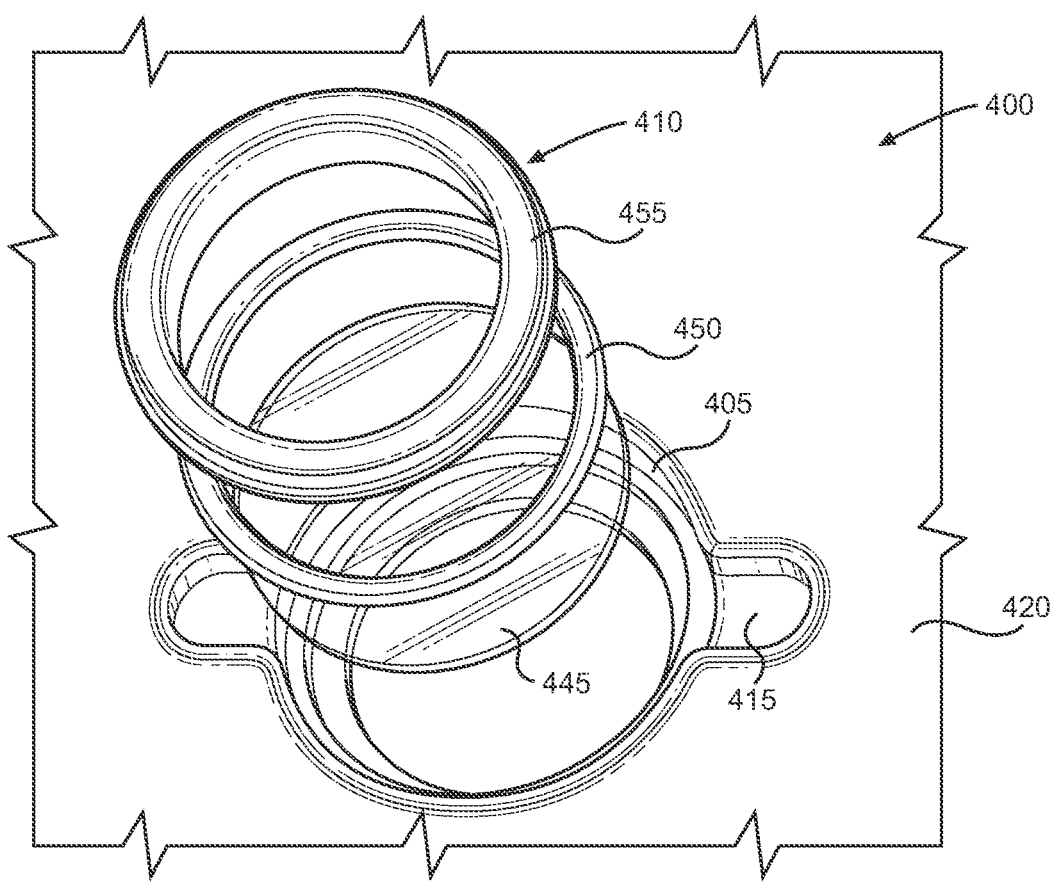
FIG. 4B shows an exploded view of the seal and window retainer of FIG. 4A.

FIG. 4B provides an exploded view of window assembly 410. This view highlights the circular shape of hole 405, plate 445, seal 450 and retainer 455. No threaded fasteners (e.g., screws) are needed to secure window assembly 410 within hole 405. In other words, window assembly 420 does not include a threaded fastener. This reduces particle generation, thereby reducing the chances of contaminating a reticle supported on inner base plate 400. Preferably, inner base plate 400 is made from aluminum and plate 445 is made from glass, while each of seal 450 and retainer 455 is made from a polymer. Non-limiting examples of polymers suitable as polymer seals include fluorinated polymers, elastomeric polymers and thermoplastic elastomeric polymers. Preferred polymers are those that exhibit low levels of outgassing. The retainer may also include embodiments that are polymeric. Non-limiting examples of polymers suitable for the retainer include polyether ether ketone and polyether imide.

Figure 5A:
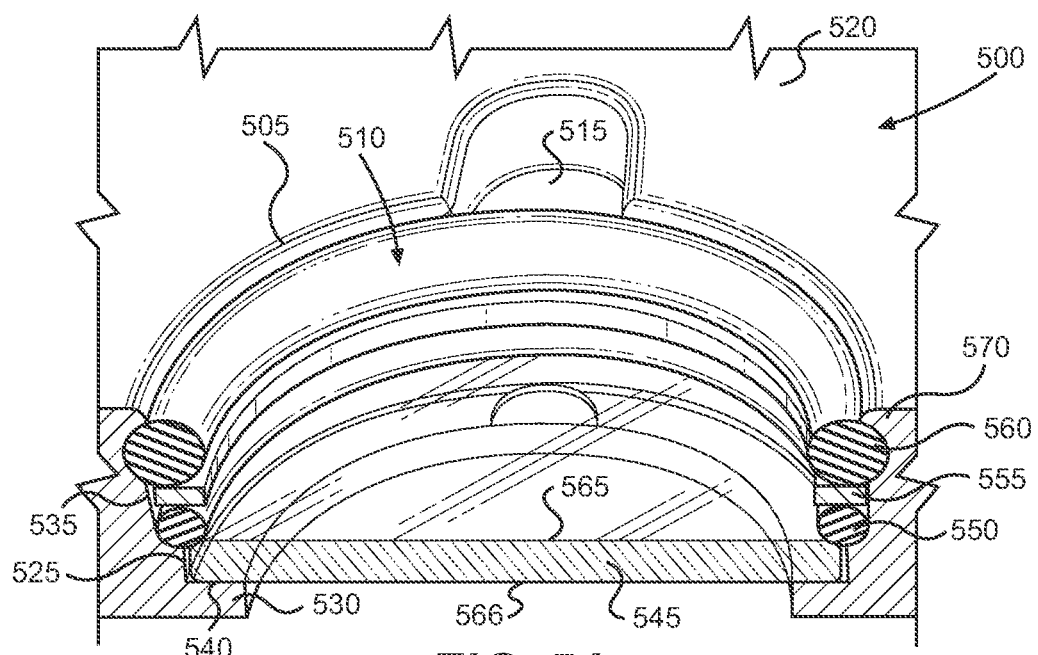
FIG. 5A shows a cross section of a window mounted in a base plate and retained in place with a separate circular seal, washer and window retainer in accordance with another embodiment of the disclosure.

With reference now to FIG. 5A, there is shown a cross section of another inner base plate 500 constructed in accordance with another embodiment of the present disclosure. Inner base plate 500 includes a hole 505 and a window assembly 510 located in hole 505. A notched recess 515 is formed in a lower (or outer) face 520 of inner base plate 500. Notched recess 515 provides access for a tool (not shown) so that window assembly 510 can be removed from hole 505 with the tool without damaging window assembly 510. Hole 505 has a perimeter (or peripheral sidewall) 525. A flange 530 extends inward from perimeter 525, and an undercut (or recess) 535 extends outward into perimeter 525. Flange 530 has a mounting surface 540. Window assembly 510 includes a transparent plate 545, a seal 550, a washer 555 and a retainer 560. Plate 545 has an outer (or lower) planar surface 565 and an inner (or upper) planar surface 566, with inner planar surface 566 in contact with mounting surface 540. Plate 545 is configured to facilitate viewing of a reticle supported on inner base plate 500. Seal 550 contacts outer planar surface 565 of plate 545 and undercut 535. Seal 550 is configured to seal the interface between window assembly 510 and hole 505. Washer 555 is located between seal 550 and retainer 560 and contacts seal 550, retainer 560 and undercut 535. Retainer 560 contacts undercut 535 and retains seal 550 and plate 545 within hole 505. In some cases, retainer 560 is configured to removably retain seal 550 and plate 545 within hole 505. This retention is due to inner base plate 500 extending across window assembly 510 from above and below, thereby preventing vertical movement of window assembly 510. In particular, the inclusion of undercut 535 results in a second flange 570 extending inward from perimeter 525. Flange 570 prevents windows assembly 510 from moving outward (or down) through hole 505, while flange 530 prevents window assembly 510 from moving inward (or up) through hole 505. That is, contact between flange 570 and retainer 560 prevents outward movement of retainer 560, and contact between washer 555 and retainer 560 prevents inward movement of retainer 560 since washer 555, seal 550 and plate 545 are held in place by flange 530 in that direction. Similarly, contact between flange 530 and plate 545 prevents inward movement of plate 545, and contact between seal 550 and plate 545 prevents outward movement of plate 545 since seal 550, washer 555 and retainer 560 are held in place by flange 570 in that direction.

Figure 5B:
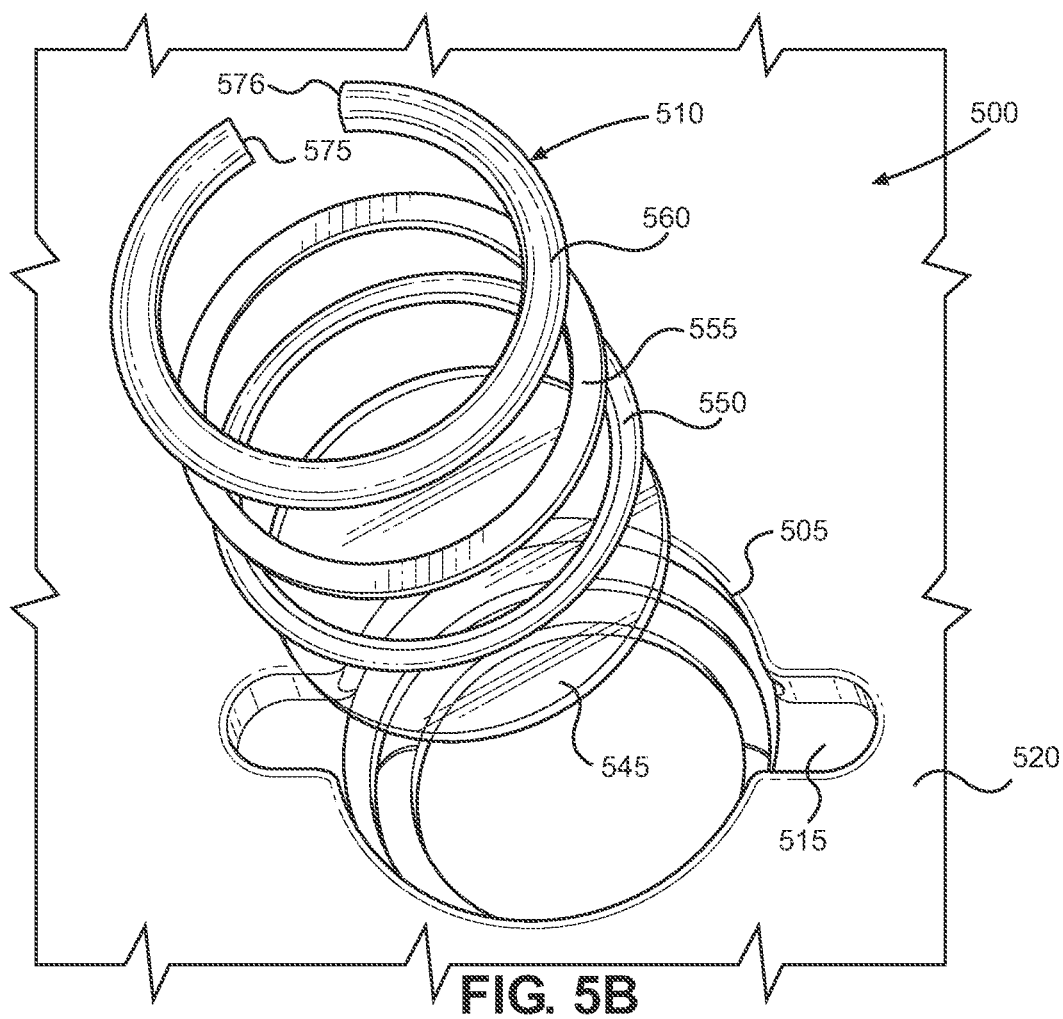
FIG. 5B shows an exploded view of the seal, washer and window retainer of FIG. 5A.

FIG. 5B provides an exploded view of window assembly 510. This view highlights the circular shape of hole 505, plate 545, seal 550, washer 555 and retainer 560. In addition, a gap is provided between a first end 575 and a second end 576 of retainer 560. This space facilitates retainer 560 to be contracted during installation of window assembly 510 such that retainer 560 functions as a snap ring. No threaded fasteners (e.g., screws) are needed to secure window assembly 510 within hole 505. In other words, window assembly 510 does not include a threaded fastener. This reduces particle generation, thereby reducing the chances of contaminating a reticle supported on inner base plate 500. Preferably, inner base plate 500 is made from aluminum, plate 545 is made from glass and seal 550 is made from a polymer, while each of washer 555 and retainer 560 is made from stainless steel. Non-limiting examples of polymers suitable as polymer seals include fluorinated polymers, elastomeric polymers and thermoplastic elastomeric polymers. Preferred polymers are those that exhibit low levels of outgassing. The retainer may also include embodiments that are polymeric. Non-limiting examples of polymers suitable for the retainer include polyether ether ketone and polyether imide. Non-limiting examples of polymers suitable as polymer seals include fluorinated polymers, elastomeric polymers and thermoplastic elastomeric polymers. Preferred polymers are those that exhibit low levels of outgassing. The retainer may also include embodiments that are polymeric. Non-limiting examples of polymers suitable for the retainer include polyether ether ketone and polyether imide.

Figure 6A:
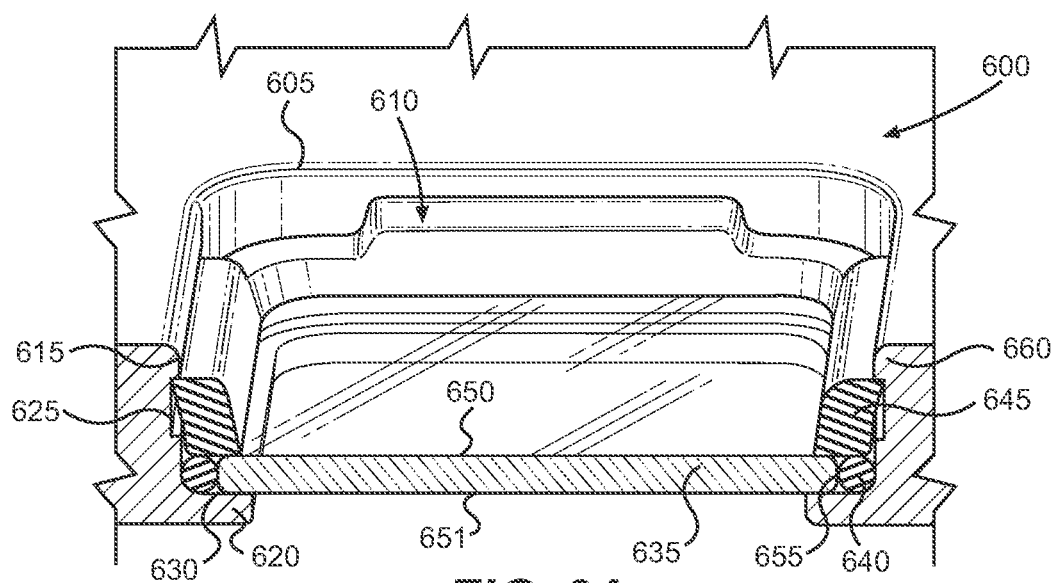
FIG. 6A shows a cross section of a window mounted in a base plate and retained in place with a separate rectangular seal and window retainer in accordance with yet another embodiment of the disclosure.

With reference now to FIG. 6A, there is shown a cross section of still another inner base plate 600 constructed in accordance with yet another embodiment of the present disclosure. Inner base plate 600 includes a hole 605 and a window assembly 610 located in hole 605. Hole 605 has a perimeter (or peripheral sidewall) 615. A flange 620 extends inward from perimeter 615, and an undercut (or recess) 625 extends outward into perimeter 615. Flange 620 has a mounting surface 630. Window assembly 610 includes a transparent plate 635, a seal 640 and a retainer 645. Plate 635 has an outer (or lower) planar surface 650 and an inner (or upper) planar surface 651, with inner planar surface 651 in contact with mounting surface 630. Plate 635 is configured to facilitate viewing of a reticle supported on inner base plate 600. Seal 640 contacts perimeter 615, mounting surface 630 and a side planar surface 655 of plate 635. Seal 640 is configured to seal the interface between window assembly 610 and hole 605. Retainer 645 contacts seal 640, undercut 625 and outer planar surface 650 of plate 635. Retainer 645 is configured to retain seal 640 and plate 635 within hole 605. In some cases, retainer 645 is configured to removably retain seal 640 and plate 635 within hole 605. This retention is due to inner base plate 600 extending across window assembly 610 from above and below, thereby preventing vertical movement of window assembly 610. In particular, the inclusion of undercut 625 results in a second flange 660 extending inward from perimeter 615. Flange 660 prevents windows assembly 610 from moving outward (or down) through hole 605, while flange 620 prevents window assembly 610 from moving inward (or up) through hole 605. That is, contact between flange 660 and retainer 645 prevents outward movement of retainer 645, and contact between seal 640, plate 635 and retainer 645 prevents inward movement of retainer 645 since seal 640 and plate 635 are held in place by flange 620 in that direction. Similarly, contact between flange 620 and plate 635 prevents inward movement of plate 635, and contact between retainer 645 and plate 635 prevents outward movement of plate 635 since retainer 645 is held in place by flange 660 in that direction.

Figure 6B:
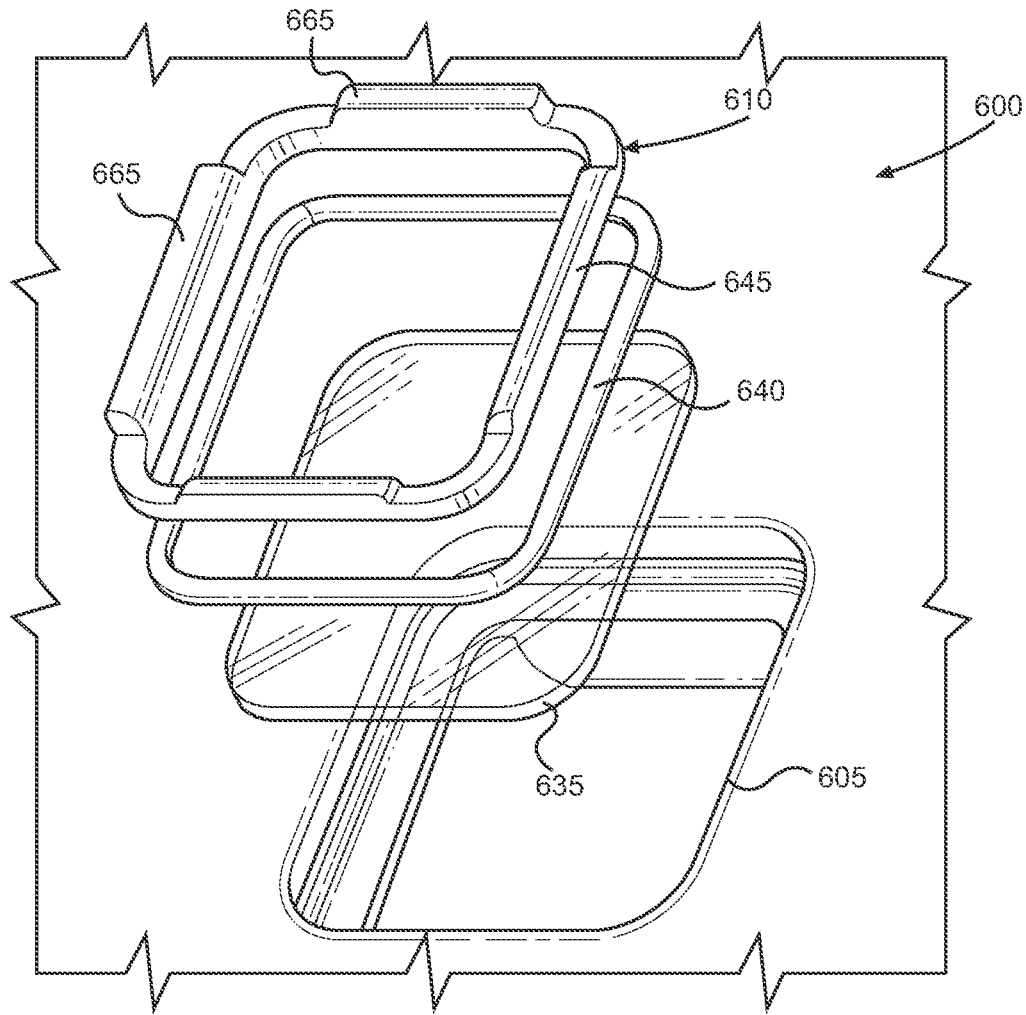
FIG. 6B shows an exploded view of the seal and window retainer of FIG. 6A.

FIG. 6B provides an exploded view of window assembly 610. This view highlights the rectangular shape of hole 605, plate 635, seal 640 and retainer 645, although this shape is more accurately termed a rounded rectangle. In addition, retainer 645 includes a plurality of protrusions 665. It is protrusions 665 that contact flange 660 when window assembly 610 is installed. No threaded fasteners (e.g., screws) are needed to secure window assembly 610 within hole 605. This reduces particle generation, thereby reducing the chances of contaminating a reticle supported on inner base plate 600. Preferably, inner base plate 600 is made from aluminum and plate 635 is made from glass, while each of seal 640 and retainer 645 is made from a polymer. Non-limiting examples of polymers suitable for the retainer include polyether ether ketone and polyether imide. Non-limiting examples of polymers suitable as polymer seals include fluorinated polymers, elastomeric polymers and thermoplastic elastomeric polymers. Preferred polymers are those that exhibit low levels of outgassing. The retainer may also include embodiments that are polymeric. Non-limiting examples of polymers suitable for the retainer include polyether ether ketone and polyether imide.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A pod for transporting reticles comprising:
   a cover; and
   an inner base plate configured to cooperate with the cover to establish a space for mounting a reticle, the inner base plate including
   a hole having a perimeter,
   a first flange extending inward from the perimeter and having a mounting surface,
   a second flange extending inward from the perimeter, and
   a window assembly configured to be mounted in the hole, the window assembly having
   a transparent plate with inner, outer and side planar surfaces, the inner surface configured to contact the mounting surface,
   a seal contacting the outer or side planar surface of the transparent plate and configured to contact the perimeter of the hole and to seal an interface between the window assembly and the hole, and
   a retainer configured to contact the second flange and to retain the seal and transparent plate within the hole;
   wherein the hole is formed with an undercut area extending outward into the perimeter to receive the retainer.

2. The pod according to claim 1, wherein the retainer is made of a polymer.

3. The pod according to claim 1, wherein the transparent plate is a rounded rectangle or is circular.

4. The pod according to claim 1, wherein the retainer is configured to contact the second flange and to removably retain the seal and transparent plate within the hole.

5. The pod according to claim 1, wherein the inner base plate is formed with a notched recess to facilitate removal of the window assembly with a tool and an undercut area at the perimeter to receive the retainer.

6. The pod according to claim 1, wherein the transparent plate is configured to facilitate viewing of a reticle supported on the inner base plate from outside the pod.

* * * * *